United States Patent
Cavallo et al.

(10) Patent No.: US 12,328,913 B1
(45) Date of Patent: Jun. 10, 2025

(54) VERTICAL SPINTRONIC DEVICES BASED ON DISLOCATIONS IN SINGLE-CRYSTALLINE SEMICONDUCTORS AND METHODS FOR THEIR PRODUCTION

(71) Applicant: UNM RAINFOREST INNOVATIONS, Albuquerque, NM (US)

(72) Inventors: Francesca Cavallo, Albuquerque, NM (US); Mengistie Debasu, Albuquerque, NM (US); Max G. Lagally, Albuquerque, NM (US); Emma J. Renteria, Albuquerque, NM (US); Finley Haines, Albuquerque, NM (US)

(73) Assignee: UNM RAINFOREST INNOVATIONS, Albuquerque, NM (US)

(*) Notice: Subject to any disclaimer, the term of this patent is extended or adjusted under 35 U.S.C. 154(b) by 370 days.

(21) Appl. No.: 17/836,705

(22) Filed: Jun. 9, 2022

Related U.S. Application Data

(60) Provisional application No. 63/209,289, filed on Jun. 10, 2021.

(51) Int. Cl.
  *H10D 48/00* (2025.01)
  *G01R 33/09* (2006.01)
  *H10D 48/40* (2025.01)
  *H10N 50/01* (2023.01)
  *H10N 50/10* (2023.01)
  *G11C 11/16* (2006.01)

(52) U.S. Cl.
  CPC ........ *H10D 48/385* (2025.01); *G01R 33/093* (2013.01); *H10D 48/40* (2025.01); *H10N 50/01* (2023.02); *H10N 50/10* (2023.02); *G11C 11/161* (2013.01)

(58) Field of Classification Search
  CPC ... H01L 29/66984; H01L 29/82; H01L 29/10; H10N 50/01; H10N 50/10; G11C 11/161; G01R 33/093
  USPC .......................................... 257/295
  See application file for complete search history.

(56) References Cited

U.S. PATENT DOCUMENTS

| | | | | |
|---|---|---|---|---|
| 9,360,604 B2* | 6/2016 | Kang | ..................... | C08F 293/00 |
| 2003/0148234 A1* | 8/2003 | Saitou | ..................... | G03C 1/015 |
| | | | | 430/569 |
| 2003/0207220 A1* | 11/2003 | Saitou | ..................... | G03C 1/015 |
| | | | | 430/569 |
| 2004/0217352 A1* | 11/2004 | Forbes | ................ | H01L 29/1054 |
| | | | | 257/65 |
| 2020/0091162 A1* | 3/2020 | Morris | ................ | H01L 27/0886 |

(Continued)

*Primary Examiner* — Jami Valentine Miller
(74) *Attorney, Agent, or Firm* — MH2 Technology Law Group LLP

(57) ABSTRACT

A semiconductor spintronic device is disclosed, which includes a substrate, a first ferromagnetic contact layer and a second ferromagnetic contact layer disposed on the substrate, and a semiconductor nanomembrane, disposed between the first ferromagnetic contact layer and the second ferromagnetic contact layer. The semiconductor spintronic device can include a screw dislocation throughout the thickness of the semiconductor nanomembrane layers. Methods of fabricating and operating a semiconductor spintronic device are also disclosed.

11 Claims, 12 Drawing Sheets

(56) References Cited

U.S. PATENT DOCUMENTS

2021/0091746 A1\*  3/2021  Gokhale .............. H03H 9/0542
2024/0389366 A1\*  11/2024  Or-Bach ................ H10B 80/00

\* cited by examiner

VERTICAL SPINTRONIC DEVICES BASED ON DISLOCATIONS IN SINGLE-CRYSTALLINE SEMICONDUCTORS AND METHODS FOR THEIR PRODUCTION

STATEMENT OF GOVERNMENT INTEREST

This invention was made with government support under DE-FG02-03ER46028 and DE-SC0020186, awarded by the Department of Energy and under NSF CAREER award No. 2144944, awarded by the National Science Foundation. The government has certain rights in the invention.

TECHNICAL FIELD

The present teachings relate generally to the field of semiconductor spintronic devices, and more particularly to semiconductor vertical spin valves or spin field effect transistors having screw dislocation networks and fabrication methods of the same.

BACKGROUND

Spintronic devices of various configurations and compositions can be used to store, process, and transfer information in classical and quantum computing architectures. The inclusion of networks of screw dislocations (SD) in single-crystalline semiconductors have been theoretically predicted to exhibit a unique 1D spin-orbit coupling (SOC) effect along the dislocation core. Vertical spin valves and spin field effect transistors (spin-FETs) having screw dislocation networks and using magnetism promise several advantages for semiconductor spintronics.

Spintronic devices including magnetic random-access memories (MRAMs) are commercially available, and capable of operation at high temperatures. However, the standard barrier layers in such devices, including non-magnetic layers, are limited to materials such as aluminum oxide and magnesium oxide. These non-magnetic materials are used in the form of thin layers, on the order of 1 nm to 2 nm, in spin valves, which can be challenging in terms of uniform deposition and longevity. Furthermore, these layers can be damaged over time with use. While devices having these materials sets can last a number of years, improvements are desirable. Materials can be produced in thicker configurations, however, such spintronic devices must then be used at lower temperatures to increase spin diffusion lengths in the barrier layer, which leads to higher costs and complexity of the system.

Therefore, it is desirable to design and fabricate improved spintronic devices, including vertical spin valves or spin-FETs having tunable polarization properties utilizing screw dislocation networks that can be fabricated using scalable methods and having consistent and predictable properties.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

Examples of the present disclosure include a semiconductor spintronic device. The semiconductor spintronic device includes a substrate, a first ferromagnetic contact layer and a second ferromagnetic contact layer disposed on the substrate. The semiconductor spintronic device also includes a semiconductor nanomembrane which may include a 2D array of screw dislocations throughout its thickness disposed between the first ferromagnetic contact layer and the second ferromagnetic contact layer.

Implementations of the semiconductor spintronic device may include where the first ferromagnetic contact layer is in direct contact with the substrate and may include a soft ferromagnetic material, and the second ferromagnetic contact layer may include a hard ferromagnetic material. The semiconductor spintronic device is switchable between a low-resistance state and a high-resistance state by applying current to the semiconductor spintronic device. The semiconductor nanomembrane may include silicon carbide and the substrate may include silicon carbide. The semiconductor nanomembrane may include a multilayered semiconductor nanomembrane. A second layer of the multilayered semiconductor nanomembrane can be overlaid upon a first layer of the multilayered semiconductor nanomembrane at a controlled twist angle from 0 degrees to about 45 degrees, which is applicable to crystals having cubic lattice structures. The semiconductor nanomembrane has a thickness of from about 50 nm to about 500 nm and a lateral dimension of from about 50 μm to about 600 μm. The semiconductor spintronic device may include a first barrier layer disposed between the semiconductor nanomembrane and the second ferromagnetic contact layer, and a second barrier layer disposed between the semiconductor nanomembrane and the first ferromagnetic contact layer. The semiconductor spintronic device may include a metal electrode in contact with a barrier layer disposed upon the semiconductor nanomembrane. The semiconductor spintronic device can be a vertical spin valve. The semiconductor spintronic device can be a spin field effect transistor.

A method of fabricating a semiconductor spintronic device is also disclosed. The method of fabricating a semiconductor spintronic device includes patterning a first plurality of nanomembranes onto a substrate, fabricating a second plurality of nanomembranes, overlaying the second plurality of nanomembranes onto the first plurality of nanomembranes at a controlled twist angle, and annealing the substrate, the first plurality of nanomembranes, and the second plurality of nanomembranes at an elevated temperature.

Implementations of the method of fabricating a semiconductor spintronic device may include where the controlled twist angle is from 0 degrees to about 45 degrees. A combined thickness of the first plurality of nanomembranes and the second plurality of nanomembranes can be from about 50 nm to about 500 nm and can have a lateral dimension of from about 200 50 μm to about 600 μm. The substrate, the first plurality of nanomembranes, and the second plurality of nanomembranes are annealed at a temperature from about 400° C. to about 1200° C.

A method of operating a semiconductor spintronic device is disclosed which includes applying a first magnetic field to semiconductor spintronic device in a direction parallel to one or more layers of the semiconductor spintronic device which may include a substrate, a first ferromagnetic contact layer and a second ferromagnetic contact layer disposed on the substrate. The semiconductor nanomembrane may include a 2D array of embedded screw dislocations, disposed between the first ferromagnetic contact layer and the second ferromagnetic contact layer. The method of operating a semiconductor spintronic device also includes switching a spin polarization within the semiconductor spintronic device. The method of operating a semiconductor spintronic device may include applying a gate voltage between a surrounding metal electrode having a dielectric barrier and a ground wherein the metal electrode and the dielectric barrier are disposed on the semiconductor spintronic device. The method of operating a semiconductor spintronic device may include injecting a current into the semiconductor spintronic device. The current flows from the first ferromagnetic contact layer to the second ferromagnetic contact layer or the current flows from the second ferromagnetic contact layer to the first ferromagnetic contact layer.

The features, functions, and advantages that have been discussed can be achieved independently in various implementations or can be combined in yet other implementations further details of which can be seen with reference to the following description.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

Figure 1A:
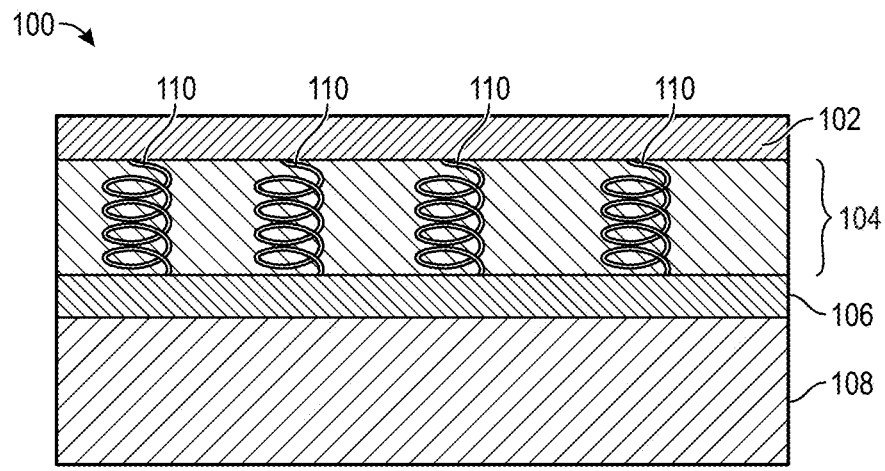
FIGS. 1A and 1B are a cross-sectional schematic view of a semiconductor spintronic device based on 1D spin-orbit coupling in screw dislocations and schematic of overlapping membranes at a controlled angle and a general schematic describing an approach for fabricating semiconductor-based devices having embedded screw dislocations, in accordance with the present disclosure.

It should be noted that some details of the figures have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

The present disclosure provides semiconductor spintronic devices fabricated from single-crystalline semiconductor materials, such as vertical spin valves (VSV) or spin field effect transistors (spin-FETs) based on semiconductor nanomembranes (NMs) engineered with arrays of screw dislocations throughout their thickness, as shown in FIG. 1. While a single pixel of a device illustrating a single layer of nanomembranes is shown, it should be understood that semiconductor spintronic devices as described herein can include multilayered nanomembranes, which may be referred to as one or more of a plurality of nanomembrane layers, when semiconductor spintronic devices are formed from multiple pixels. Multiple pixels can be referred to as an array of pixels, and therefore an array of pixels can include one or more of a plurality of nanomembrane layers. Dislocated NMs are sandwiched between two ferromagnetic contacts on a substrate surface. The VSV relies on injection of polarized spin from a hard ferromagnetic contact into a 2D array of screw dislocations in a semiconductor NM. The distinctive symmetry of a screw dislocation generates a helical electric field and a magnetic field that interact with spin-polarized electrons by restricting any changes in spin polarization (due to changes in the momentum of the electrons) between 0 and 45°. Additionally, spin-orbit-coupled electrons within screw dislocations are expected to reside deep in the semiconductor bandgap, i.e., far from electrons with unpolarized spin. This feature will potentially prevent hybridization between polarized and unpolarized electrons in the semiconductor. Thus, spin polarization resulting from screw-dislocation-induced spin-orbit coupling promises to have a relatively long coherence time. After transport along the screw dislocations, polarized spins reach the second ferromagnetic contact. Only spins that are aligned with magnetic moments in the ferromagnetic material are transmitted. In the VSV, if both ferromagnetic contacts are polarized in the same direction, the device has relatively low electrical resistance, whereas if the applied magnetic field is reversed and the soft ferromagnet polarity also reverses, the device has a higher resistance. In examples of the present disclosure, switching in semiconductor devices having embedded screw dislocations can be controlled by the applied magnetic field. In other examples of semiconductor devices having embedded screw dislocations, a current-driven mode of operation that relies on spin-transfer torque can be used. Use of semiconductor materials can be advantageous for integration and allow for operation of such devices at room temperature and above.

Screw dislocations (SDs) within single-crystalline semiconductors are relevant to spintronic in that SDs have been theoretically predicted to exhibit a unique 1D spin-orbit coupling (SOC) effect along the dislocation core. This SOC effect provides large spin diffusion lengths at room temperature and above, and the possibility of tunable spin textures. This 1D SD-SOC resides deep in the band gap of semiconductors, completely isolated from the bulk bands. It also has a much higher degree of spin coherency than the 2D SOC, which is tunable by the ionicity of a compound semiconductor. The unique symmetry of a screw dislocation generates a helical electric field and a magnetic field that interact with spin-polarized electrons by restricting any changes in spin polarization, due to changes in the momentum of the electrons, between 0 and 90°. Additionally, spin-orbit-coupled electrons within screw dislocations are expected to reside deep in the semiconductor bandgap, for example, far from the electrons with unpolarized spin. Thus, screw dislocations hold the promise to produce coherent, highly polarized spin currents that are useful for spintronic devices. A method to realize defined dislocation arrangements in a reproducible way is by semiconductor direct bonding of single-crystalline semiconductor nanomembranes. The dislocation spacing can be controlled by the twist angle as shown Frank's relation, below:

$$D = \frac{a}{2\sqrt{2}\sin\left(\frac{\psi_b}{2}\right)}$$

where D is the dislocation spacing; a is a semiconductor lattice constant; and $\psi_b$ is the twist angle between two nanomembrane layers.

Figure 1B:
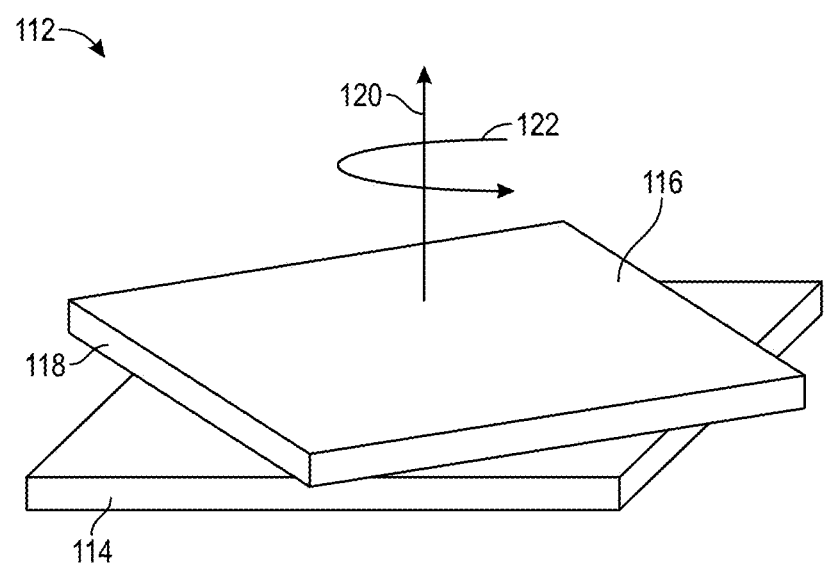

FIGS. 1A and 1B are a cross-sectional schematic view of a semiconductor spintronic device based on 1D spin-orbit coupling in screw dislocations and a schematic diagram of overlapping membranes at a controlled angle and a general schematic describing an approach for fabricating semiconductor-based devices having embedded screw dislocations, in accordance with the present disclosure. The semiconductor spintronic device 100 in FIG. 1A is illustrated in cross-section, representing a single pixel of an array of pixels, which would be incorporated into a semiconductor spintronic device, showing a layer including two semiconductor nanomembranes 104 between a soft ferromagnetic layer 102 and a hard ferromagnetic layer 106 on top of a silicon substrate 108. A representation of a two-dimensional (2D) array of screw dislocations (SD) 110 embedded within the two nanomembranes 104 is shown as well. The soft ferromagnetic layer 102 is fabricated from Fe or Fe—Ni alloys. The hard ferromagnetic layer 106 is fabricated from Co or Al—Ni—Co alloys. Alternative examples may include materials not limited to but including silicon iron alloys with up to 5% Si and other iron alloys such as Fe—Cr alloys for the soft ferromagnetic layer 102 and Co alloys, such as Co—Cr—Fe and Co—Cr—Fe—Cu alloys or heat-treated Ni—Fe alloys for the hard ferromagnetic layer 106. In still other examples, two hard ferromagnetic layers, or a mixture or combination thereof can be used. Additional examples of suitable ferromagnets or ferromagnetic materials include, but are not limited to MnAs, (Ga·Sb) Fe, Al-based alloys, or combinations thereof. It should be noted that different NMs materials can use different ferromagnetic materials. In addition, in certain examples, some materials, for example, cobalt, when deposited in thin layers can behave as soft ferromagnets, and when thick behave as hard ferromagnets. The semiconductor nanomembrane material can include silicon, silicon carbide (SiC), and can be multilayered, wherein a second layer of the multilayered semiconductor nanomembrane is overlaid upon a first layer of the multi-layered semiconductor nanomembrane at a controlled twist angle.

The substrate material can include silicon as well. Nanomembranes may be silicon carbide (SiC), germanium (Ge), III-V binary compound semiconductors, and ternary and quaternary alloys including materials of group III and group V, or combinations thereof. An overlay 112 of two nanomembranes is shown in FIG. 1B, which includes a first semiconductor nanomembrane 114, upon which is overlaid a second semiconductor nanomembrane 116. Between the first semiconductor nanomembrane 114 and the second semiconductor nanomembrane 116 is a twist boundary 118. A rotation axis 120 is shown, which is perpendicular to a horizontal plane of the first semiconductor nanomembrane 114 and the second semiconductor nanomembrane 116, around which a controlled twist angle (θ) 122 is indicated. In examples of the present disclosure. The twist angle (θ) 122 can be from 0 to 45 degrees, or from 0 to 15 degrees, or from 0 to 10 degrees. In certain examples of the present disclosure, a combined thickness of the semiconductor nanomembranes each have a thickness of from about 50 nm to about 500 nm, or from about 100 nm to about 300 nm, or from about 150 nm to about 250 nm. In examples of the present disclosure, a barrier layer disposed upon, around or between the semiconductor nanomembrane and either of the ferromagnetic contact layers can be included in the vertical spin valve or similar semiconductor device. These barrier layers, which may also be referred to as a gate dielectric, can include materials such as, but not limited to silica ($SiO_2$), Alumina ($Al_2O_3$), and the like.

In certain examples, devices of the present disclosure can have lateral dimensions of at least 2 orders of magnitude larger than their thickness. The semiconductor nanomembrane can be fabricated in free-standing isolated forms and may be transferred to any host during device fabrication. The nanoscale thickness of the semiconductor nanomembranes provides a high probability of screw dislocations being uniform across the thickness. Different spin textures can be realized by utilizing different materials from a wide range of materials available for use in semiconductor devices, such as, but not limited to SiC, Ge, III-V binary compound semiconductors, and ternary and quaternary alloys including materials of group III and group V. Nanomembranes can conform to one another while bonding, resulting in the absence of gaps at the interface, which can allow for large uniform arrays of screw dislocations.

The pixels, or regions of NMs with a specified area in the described spintronic semiconductor devices can have lateral dimensions from about 100 µm to about 1000 µm, or from about 200 µm to about 600 µm, or from 400 µm to about 500 µm. While during fabrication, it is not necessary that the devices be pixelated, but the fabrication process in certain examples, can have a higher yield when utilizing process steps that generate pixels. In certain examples, a lower or bottom pixel may be larger than an upper or top pixel, or vice versa. For example, one pixel can be approximately 200 µm while another pixel can be approximately 400 µm. The screw dislocations formed therein are expected to run throughout the thickness of the two NMs, generating an ordered 2D array of dislocations. However, in the case of two different lateral dimensions, the screw dislocations are only present where there is overlap between two or more NM pixels. It should be further noted that the two ferromagnetic layers can also be configured in opposite orientations, for example, the soft layer can be in contact with the substrate and the hard layer can be on top of the NM pixels. The spintronic semiconductor devices as described herein can be switchable between a low-resistance state and a high-resistance state. The spintronic semiconductor devices can be switchable by an externally applied magnetic field or by a current flowing through the device through the spin-transfer torque effect.

Figure 2A:
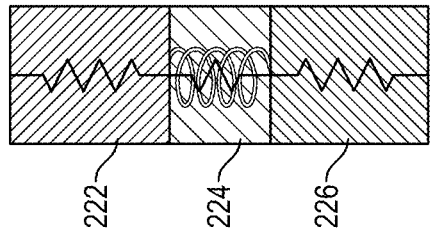
FIGS. 2A and 2B are cross-sectional schematic views of a semiconductor spintronic device operating in a low-resistance and high-resistance state, respectively, in accordance with the present disclosure.
Figure 2A:
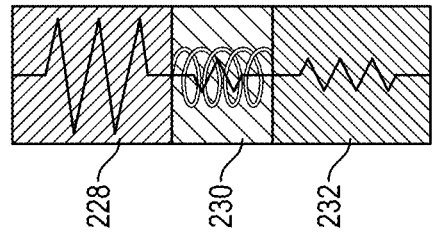
Figure 2A:
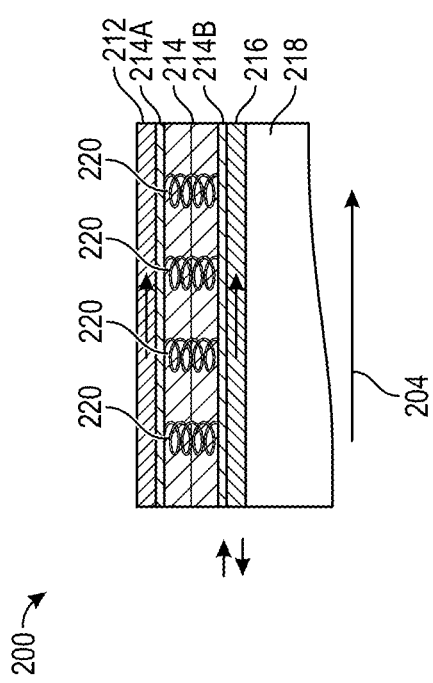
Figure 2B:
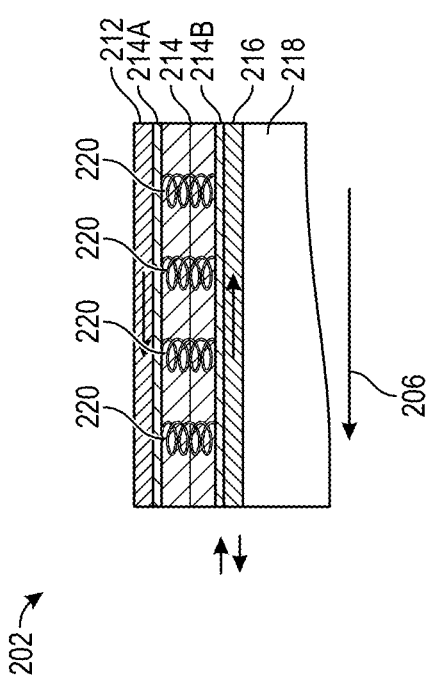

FIGS. 2A and 2B are cross-sectional schematic views of a semiconductor spintronic device valve operating in a low-resistance and high-resistance state, respectively, in accordance with the present disclosure. In the device operation scenario illustrated in FIGS. 2A and 2B, the semiconductor device based on spin transport through dislocations can switch between a high and a low resistance state "by field" in various device architecture applications. Devices according to the present disclosure may effectively be switchable filters of spin polarization leveraging coherent spin transport through SDs, depending on a low-resistance state or a high-resistance state as shown. FIG. 2A shows a schematic diagram of a semiconductor vertical spin valve in a low-resistance state 200, including a pair of semiconductor nanomembranes 214 between a soft ferromagnetic layer 212 and a hard ferromagnetic layer 216 on top of a silicon substrate 218. Also shown is a dielectric barrier layer 214A between the soft ferromagnetic layer 212 and the semiconductor nanomembranes 214 and a dielectric barrier layer 214B between the hard ferromagnetic layer 216 and the semiconductor nanomembranes 214. The screw dislocations (SD) 220 between the two nanomembranes 214 are shown as well. This vertical spin valve in a low-resistance state 200 indicates a magnetic field (B) 204 in a particular direction. FIG. 2B shows a schematic diagram of a semiconductor vertical spin valve in a high-resistance state 202, including a pair of semiconductor nanomembranes 214 between a soft ferromagnetic layer 212 and a hard ferromagnetic layer 216 on top of a silicon substrate 218. The screw dislocations (SD) 220 between the two nanomembranes 214 are shown as well. This vertical spin valve in a low-resistance state 200 indicates a magnetic field (B) 206 in an opposite direction as compared to the semiconductor vertical spin valve in a high-resistance state 202. For example, also shown in FIG. 2A is an enlarged representation of the soft ferromagnetic layer 222, nanomembrane layer 224, and hard ferromagnetic layer 226 while the soft ferromagnetic layer 222 and hard ferromagnetic layer 226 are polarized in the same direction in a low-resistance state. By contrast, FIG. 2B also depicts the soft ferromagnetic layer 228, nanomembrane layer 230, and hard ferromagnetic layer 232 while the soft ferromagnetic layer 228 and hard ferromagnetic layer 232 are polarized in opposing direction and thus in a high-resistance state. The symmetry of the screw dislocations in the device illustrated in FIGS. 2A and 2B generates a helical field that interacts with spin-polarized electrons by restricting any changes in spin polarization between 0 and 45 degrees. Only spins that are aligned with magnetic moments in the ferromagnetic material layers are transmitted. If both ferromagnetic contacts are polarized in the same direction, for example, as depicted in FIG. 2A, the device exhibits low resistance.

Examples of the present disclosure provide a semiconductor device which can include a vertical spin valve, having a substrate, a first ferromagnetic contact layer and a second ferromagnetic contact layer disposed on the substrate, with one or more layers of a semiconductor nanomembrane, disposed between the first ferromagnetic contact layer and the second ferromagnetic contact layer. The first ferromagnetic contact layer is in direct contact with the substrate and includes a soft ferromagnetic material, while the second ferromagnetic contact layer includes a hard ferromagnetic material. Certain semiconductor spin valves of the present disclosure include a screw dislocation throughout its thickness. Such vertical spin valves or semiconductor devices of the present disclosure provide a switchable filter of spin polarization, which can be switchable between a low-resistance state and a high-resistance state, in some examples by applying current to the vertical spin valve.

Figure 3A:
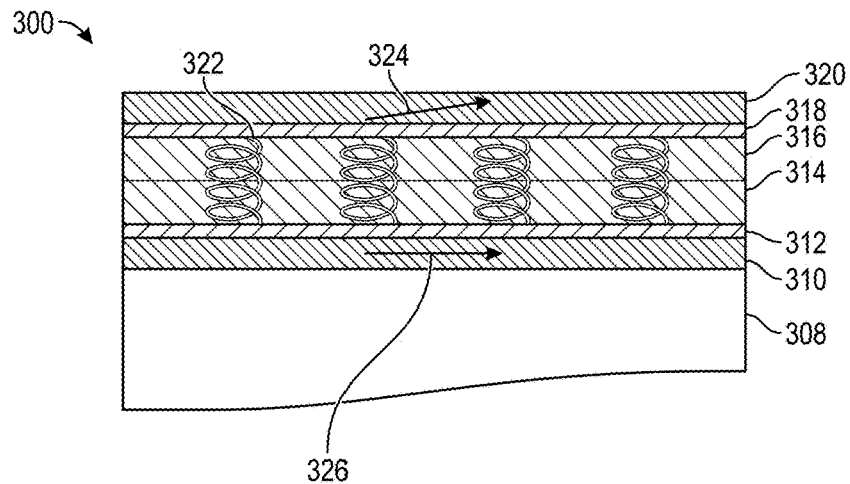
FIGS. 3A-3C are cross-sectional schematic views of a semiconductor spintronic device, in accordance with the present disclosure.
Figure 3B:
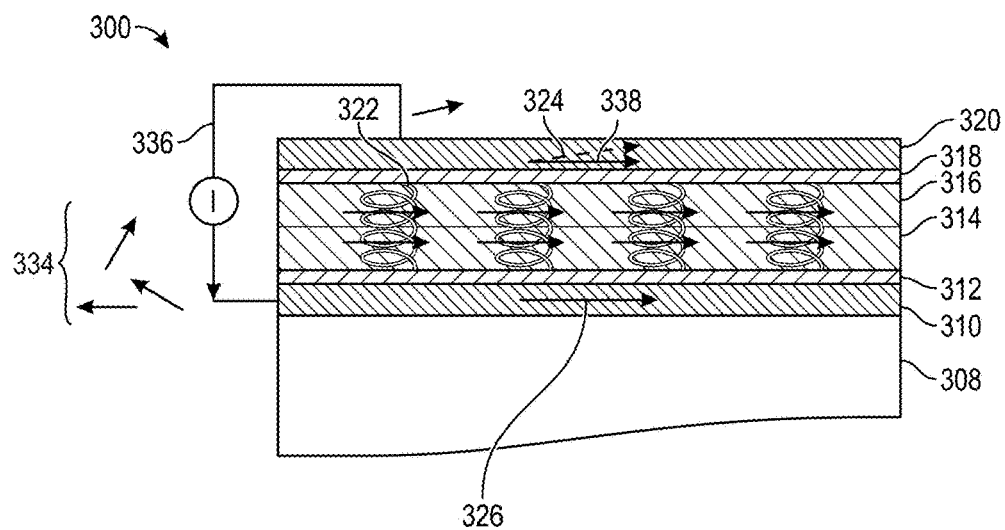
Figure 3C:
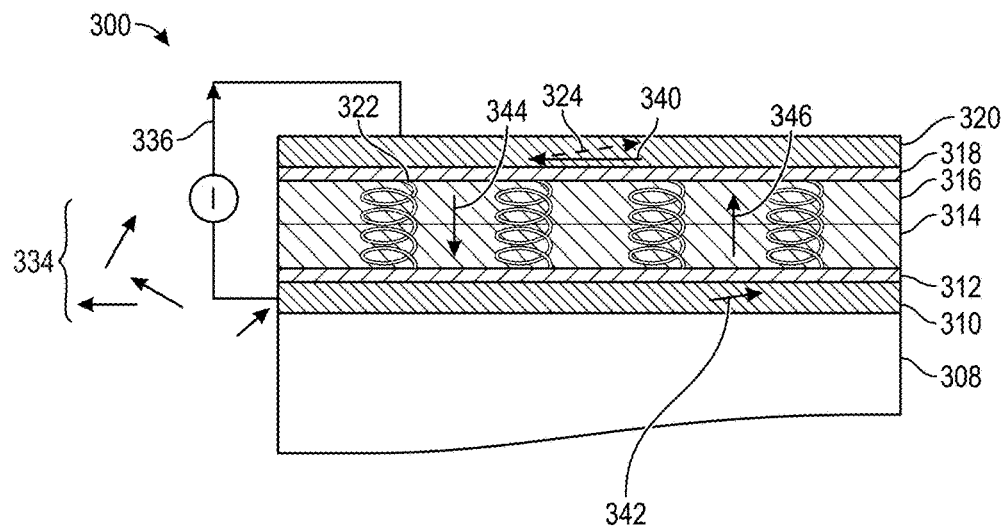

FIGS. 3A-3C are cross-sectional schematic views of a semiconductor spintronic device, in accordance with the present disclosure. In FIGS. 3A-3G a representative pixel of a semiconductor spintronic device 300 is shown to illustrate several operating mechanisms associated with the semiconductor spintronic device 300. Each pixel includes a substrate 308, a lower ferromagnetic layer 310, a dielectric barrier layer 312, followed by a first nanomembrane layer 314 coupled to a second nanomembrane layer 316. The first nanomembrane layer 314 and the second nanomembrane layer 316 are coupled together having a controlled twist angle. Next, the pixel includes a dielectric barrier layer 318 and an upper ferromagnetic layer 320. The first nanomembrane layer 314 coupled to the second nanomembrane layer 316 indicates several screw dislocations 322, while a direction of a magnetization vector 324 in the upper ferromagnetic layer 320 and a direction of a magnetization vector 326 in the lower ferromagnetic layer 310 are also indicated. FIG. 3A illustrates the state of the semiconductor spintronic device 300 with no current applied. In FIG. 3B a current 336 flows from the upper ferromagnetic layer 320 and the lower ferromagnetic layer 310 at a critical switching current, $|>|_c$, which is in a range from about −15 mA to about 15 mA. Unpolarized electrons 334 are indicated near the semiconductor spintronic device 300. A spin torque transferred from conduction of electrons aligns the magnetization vector 338 of the upper ferromagnetic layer with the magnetization vector 326 of the lower ferromagnetic layer. This places the semiconductor spintronic device 300 in a low-resistance state. As illustrated in FIG. 3O, when the critical switching current 336 is applied from the upper to the lower ferromagnetic layer, the magnetization vector 340 in the upper ferromagnetic layer 320 flips, in an opposite direction as compared to a new magnetization vector 342 of the lower ferromagnetic layer 310, placing the semiconductor spintronic device 300 in a high-resistance state. Thus, the electrical resistance can change between two values depending on the relative alignment of the magnetization in the layers of the semiconductor spintronic device 300 as induced by an applied critical switching current 336. In this high-resistance state, as shown in FIG. 3C, incident electrons 344 enter the nanomembrane layers 314, 316 aligned with the upper ferromagnetic layer 320 and when the electrons are reflected 346, they are aligned, but flipped with respect to the magnetization vector 342 of the lower ferromagnetic layer 310.

Figure 3D:
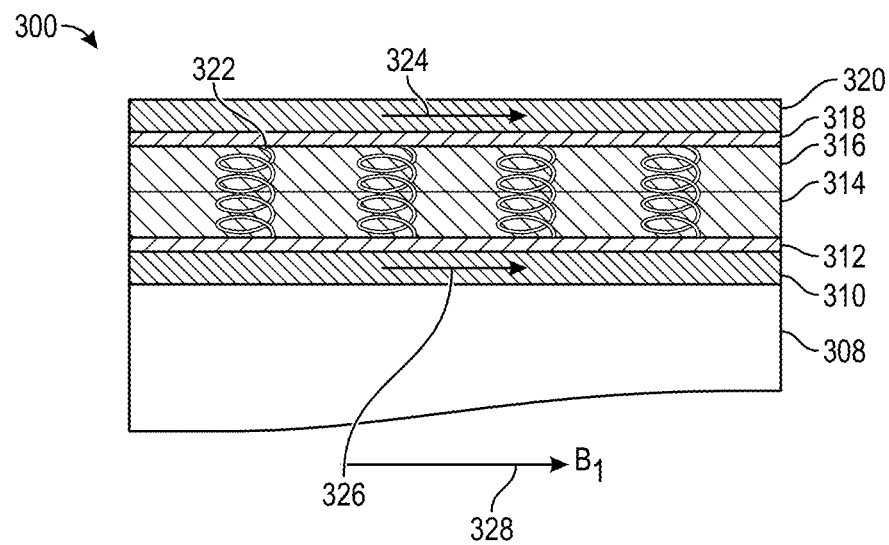
FIGS. 3D-3E are cross-sectional schematic views of a semiconductor spintronic device, in accordance with the present disclosure.
Figure 3E:
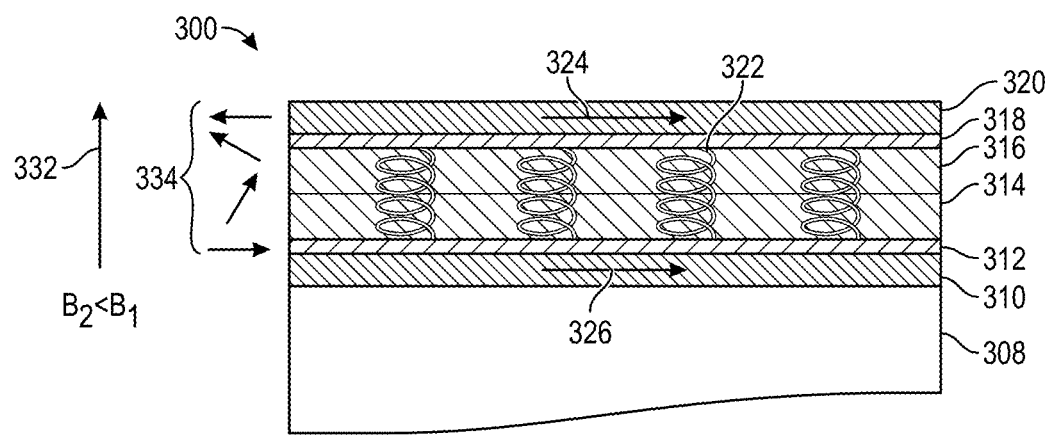

FIGS. 3D-3E are cross-sectional schematic views of a semiconductor spintronic device, in accordance with the present disclosure. FIGS. 3D-3E illustrate an operating mechanism of the semiconductor spintronic device 300 using magnetic field orientation to switch the semiconductor spintronic device 300 from a low-resistance state to a high-resistance state. FIGS. 3D and 3E show a semiconductor spintronic device 300 having fixed, hard ferromagnet layers for both the upper ferromagnetic layer 320 and the lower ferromagnetic layer 310. A direction of a first applied magnetic field 328 ($B_1$) is also indicated, reorienting the magnetization in the upper ferromagnetic layer 320 and the lower ferromagnetic layer 310. The first applied magnetic field 328 is then removed as the semiconductor spintronic device 300 is in a low-resistance state. Next, a direction of a second applied magnetic field 332 ($B_2$) which is perpendicular to one or more layers in a semiconductor spintronic device 300 is applied. As illustrated in FIG. 3E, the magnitude of the second magnetic field 332 ($B_2$) is less than that of the first magnetic field 328 ($B_1$). Following the application of the second magnetic field 332 ($B_2$), the spin as it travels through the screw dislocations 322 in the first nanomembrane layer 314 and second nanomembrane layer 316 will precess. This initiates a spin flip or a change in direction of the spin, providing unpolarized electrons 334, and placing the semiconductor spintronic device 300 into a high-resistance state.

Figure 3F:
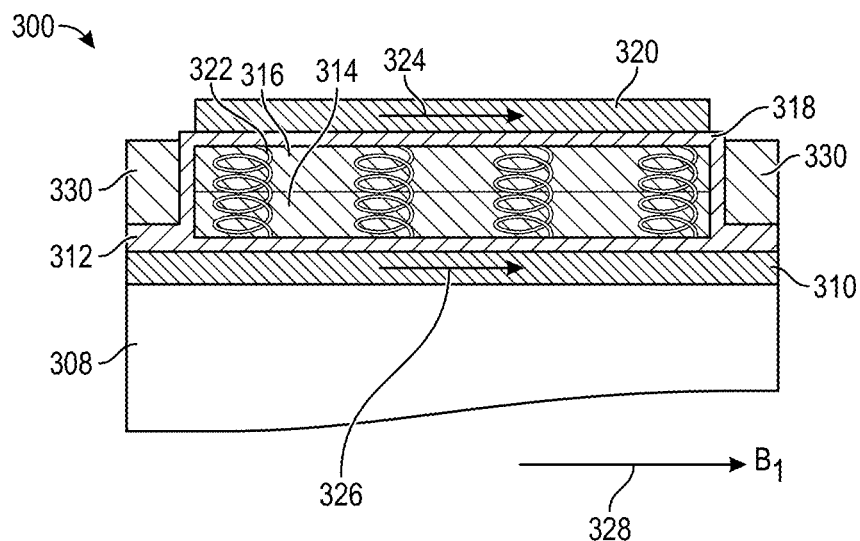
FIGS. 3F-3G are cross-sectional schematic views of a semiconductor spintronic device, in accordance with the present disclosure.
Figure 3G:
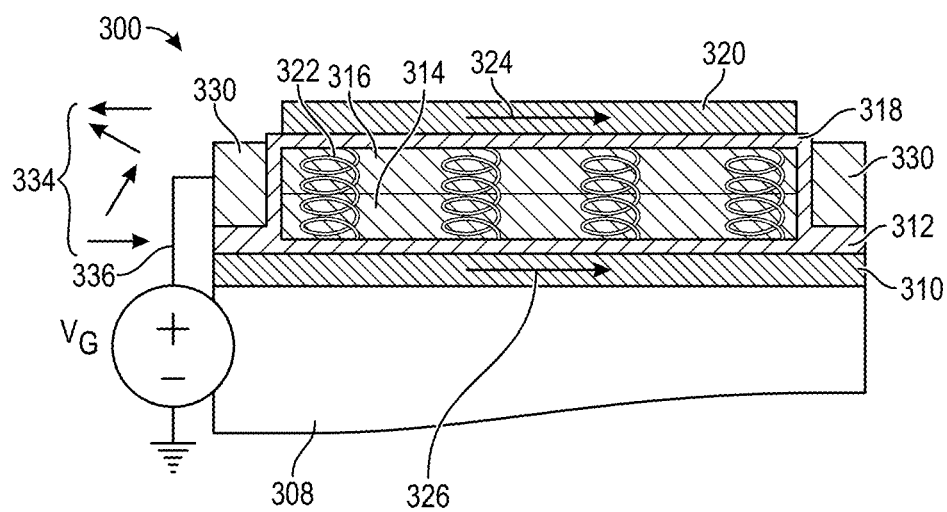

FIGS. 3F-3G are cross-sectional schematic views of a semiconductor spintronic device, in accordance with the present disclosure. The switching of the semiconductor spintronic device 300 from a low-resistance state to a high-resistance state can also be accomplished by applying a voltage to the semiconductor spintronic device 300. The representative pixel of a semiconductor spintronic device 300 shown in FIGS. 3F and 3G includes a metal electrode 330 surrounding the dielectric barrier layers 312, 318, in contrast to the representative pixel of a semiconductor spintronic device 300 shown in FIGS. 3A-3E. The ferromagnetic layers, 310, 320 are magnetized using a high first applied magnetic field 328 ($B_1$). A dielectric material surrounds the first nanomembrane layer 314 and second nanomembrane layer 316. In certain examples the lower dielectric barrier layer 312 and upper dielectric barrier layer 318 can be the same material, while in other examples of a semiconductor spintronic device 300, the lower dielectric barrier layer 312 and upper dielectric barrier layer 318 can be composed of different materials. The metal electrode 330 surrounds the pixel of the semiconductor spintronic device 300 and is in contact with one or both of the dielectric barrier layers 312, 318. It should be noted that the metal electrode can be disposed upon, next to, or surrounding a pixel in a semiconductor spintronic device as described herein. Next, a voltage is applied between the metal electrode 330 and a ground to flip the spin of the semiconductor spintronic device 300 from a low-resistance state to a high-resistance state. For example, when the voltage is equal to zero, the semiconductor spintronic device 300 is in a low-resistance state, as the two ferromagnetic layers 310, 320 are aligned, while the spin travels undisturbed through the screw dislocations 322 in the first nanomembrane layer 314 and second nanomembrane layer 316. When the voltage is applied, the spin is flipped in the semiconductor spintronic device 300 to a high-resistance state.

In general, methods of operating a semiconductor spintronic device can include applying a first magnetic field to semiconductor spintronic device in a direction parallel to one or more layers of the semiconductor spintronic device as described herein and switching a spin polarization within the semiconductor spintronic device. A method of operating a semiconductor spintronic device may further include applying a gate voltage between a surrounding metal electrode having a dielectric barrier and a ground or injecting a current into the semiconductor spintronic device. In certain examples, the current flows from the first ferromagnetic contact layer to the second ferromagnetic contact layer, while in others the current flows from the second ferromagnetic contact layer to the first ferromagnetic contact layer.

Figure 4A:
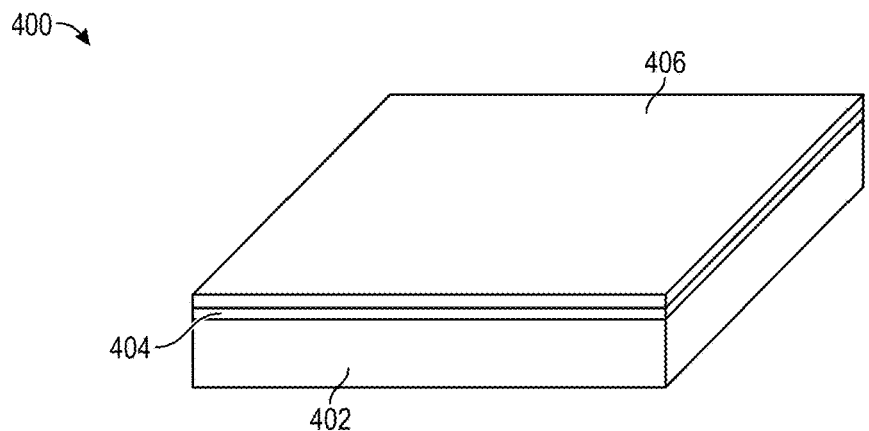
FIGS. 4A-4N depicts a series of views illustrating a scalable fabrication of 2D arrays of semiconductor spintronic devices having embedded screw dislocations in nanomembranes (NMs), in accordance with the present disclosure.
Figure 4B:
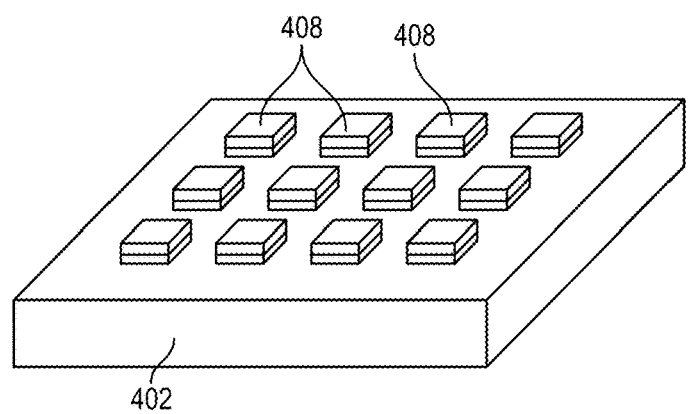
Figure 4C:
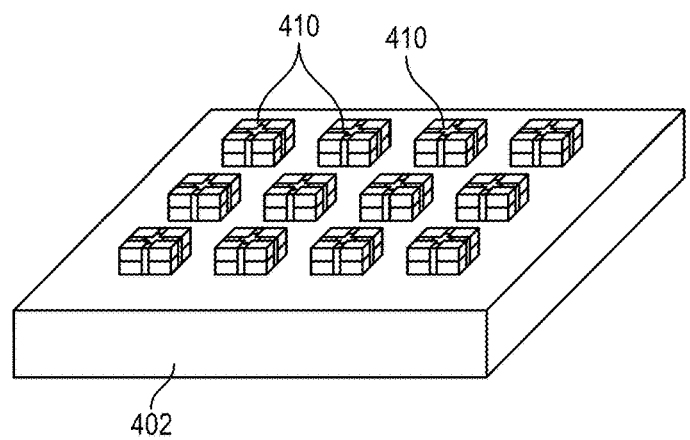
Figure 4D:
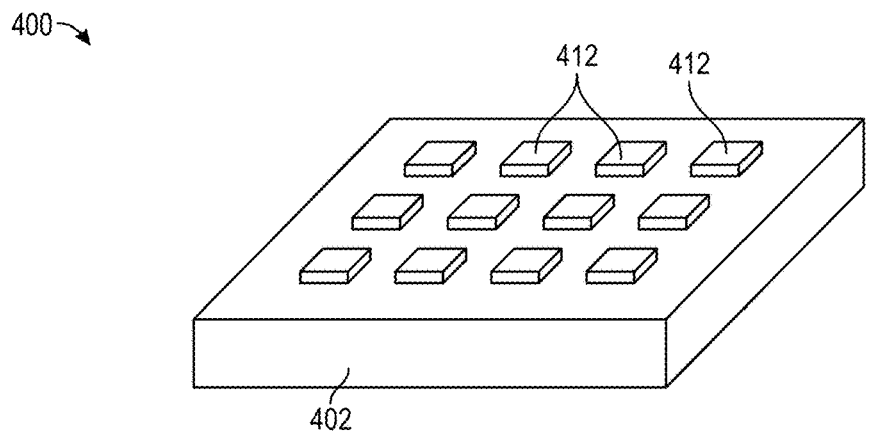
Figure 4E:
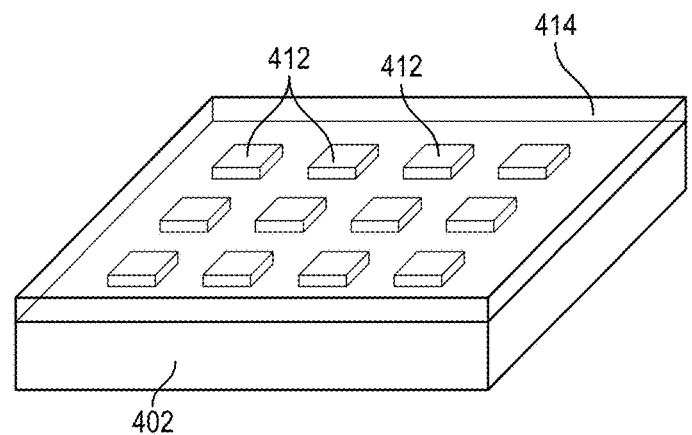
Figure 4F:
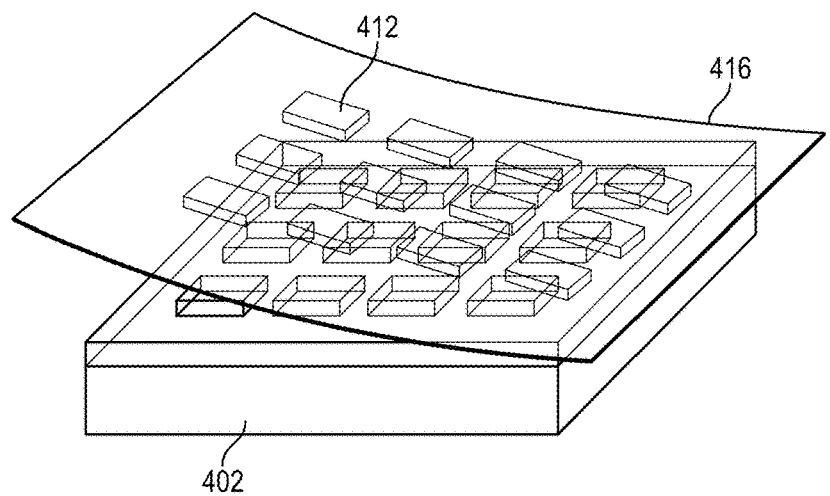
Figure 4G:
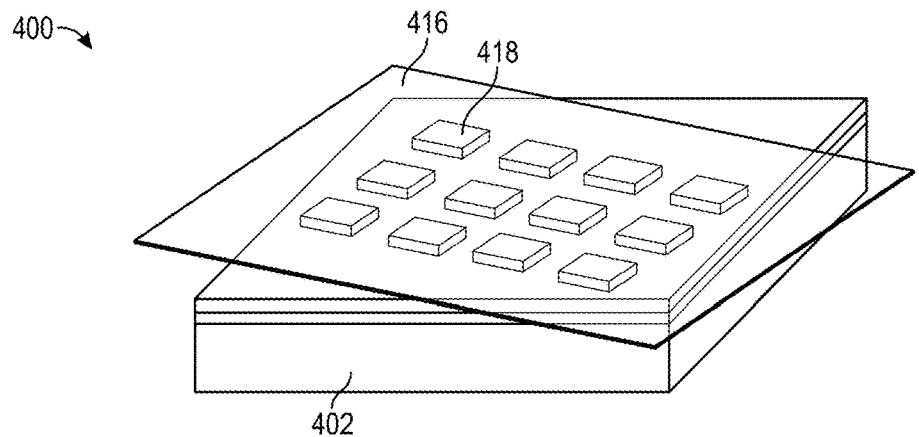
Figure 4H:
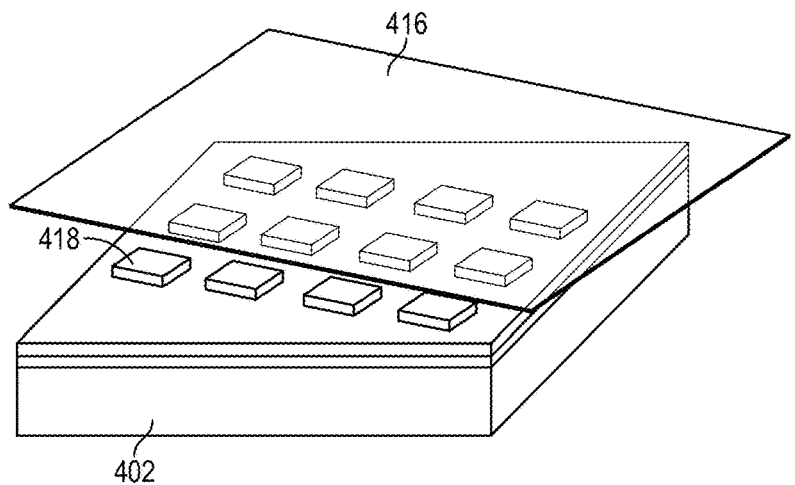
Figure 4I:
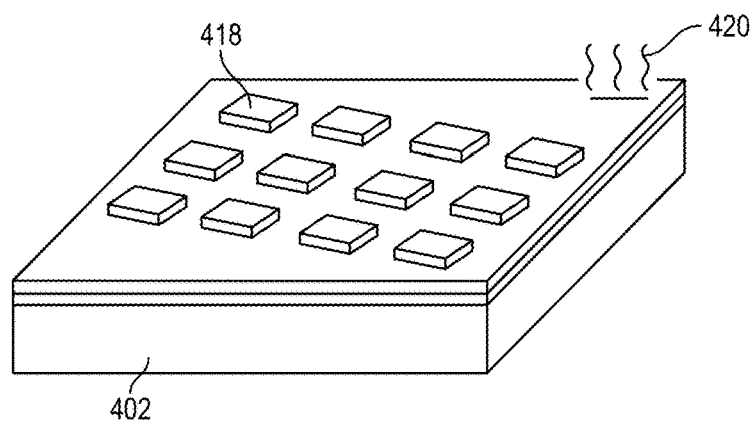
Figure 4J:
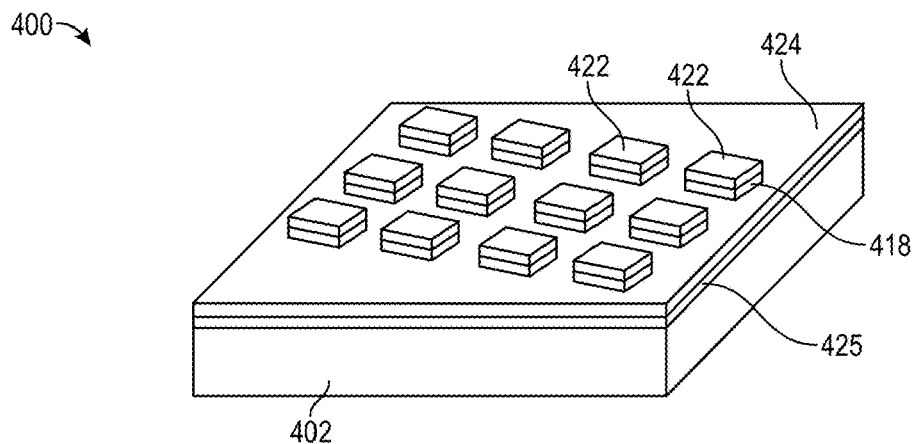
Figure 4K:
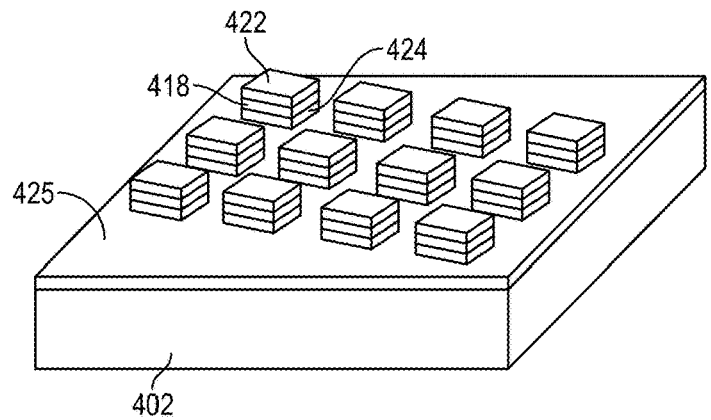
Figure 4L:
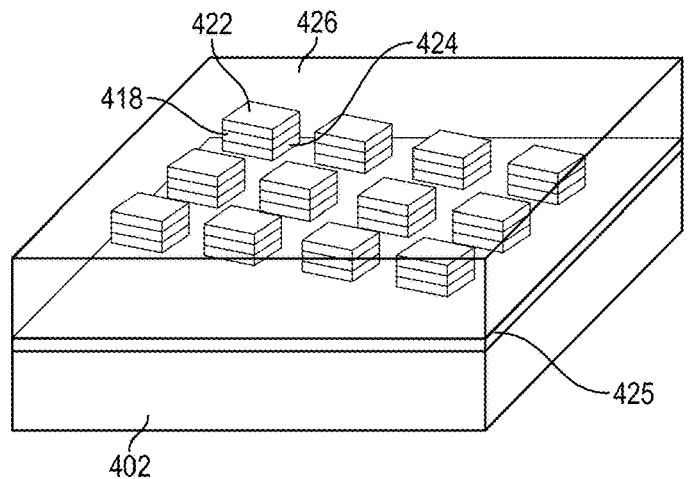
Figure 4M:
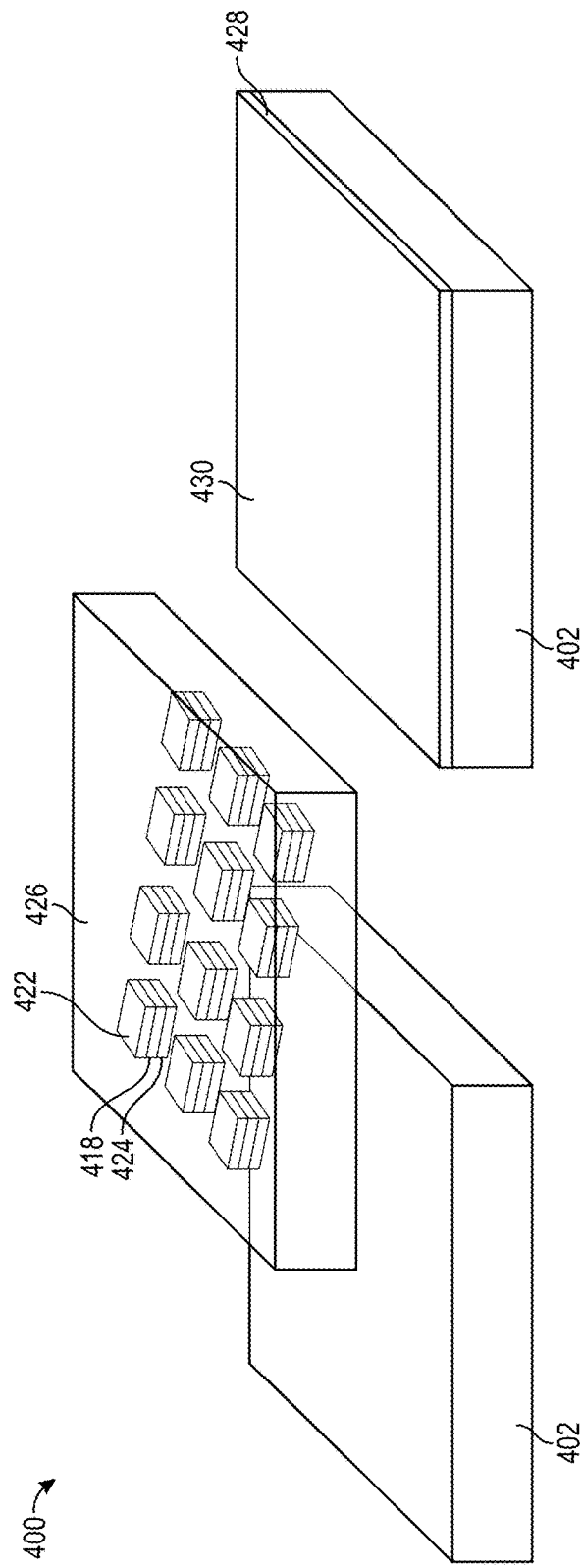
Figure 4N:
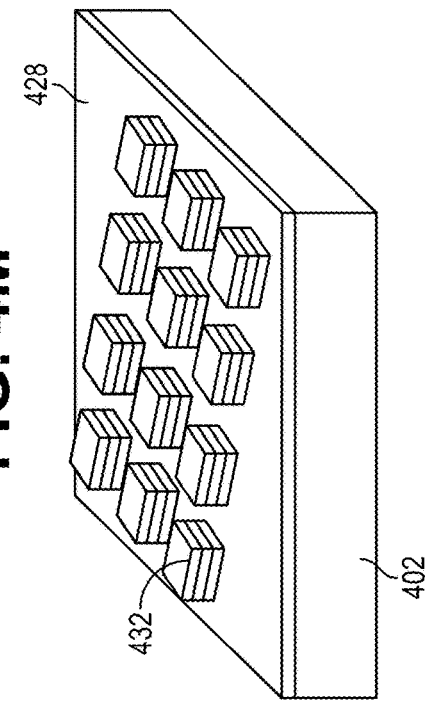

FIGS. 4A-4N depicts a series of views illustrating a scalable fabrication of 2D arrays of semiconductor spintronic devices having embedded screw dislocations in nanomembranes (NMs), in accordance with the present disclosure. The process is schematically illustrated, and it is broadly applicable to single-crystalline semiconductors that can be isolated as NMs, including elemental semiconductors and alloys. Illustrated in FIGS. 4A-4N is a fabrication process for 2D arrays of vertical spin valves 400 showing an initial step (FIG. 4A) of patterning or depositing a semiconductor nanomembrane 406 onto a silicon dioxide 404 coated silicon substrate 402, followed by (FIG. 4B) creating an array of pixelated semiconductor nanomembranes (NMs) 408 on the silicon substrate 402. In this step, the silicon substrate 402 is also pixelated. The next step (FIG. 4C) depicts anchored NM pixels 410 which are anchored by photoresist, followed by (FIG. 4D) where the Si NMs are released in place, leaving released Si NMs 412. A layer of photoresist 414 is applied to the surface in (FIG. 4E) and the NM pixels are subsequently lifted from the substrate 402 with a Kapton® polyimide tape 416 in (FIG. 4F) for transport and alignment, while holding the NM pixels in place. In certain examples, an alternative method using a stamp to pick up the pixels after the anchors have been removed can be used. In such a process step, no photoresist is spun on the sample. In the processing step shown in FIG. 4G, the Kapton® polyimide tape 416 is rotated at a twist angle θ and the rotated NMs 418 are placed back onto the substrate 402 and the Kapton® polyimide tape 416 is removed, (FIG. 4H). The photoresist (PR) is dissolved in acetone and the Kapton® polyimide tape 416 is peeled off after the PR is gone. Furthermore, alternate materials, such as, but not limited to Semiconductor Equipment Corp standard dicing tape can be used as alternatives to the Kapton® polyimide tape 416 in certain examples. In certain examples, this process step can include the patterning of a second array of pixels with larger lateral sizes than the ones in the first array, followed by an aligned transfer of one array of pixels onto another. Alignment of the twist angle may be assisted visually, such as through the use of a mask aligner, using a microscope or other means of visualization under magnification, as appropriate. It should be noted that other means of removal or rotating the NMs about a twist angle θ may be employed as well. The rotated NMs 418 are then subjected to heat annealing 420 in the step depicted in FIG. 4I. Typically, the annealing is conducted at temperatures at or greater than 1000° C. to form and propagate screw dislocations within the structures. In certain examples, the annealing is conducted in a furnace for approximately 6 hours at 1000° C. in a nitrogen or forming gas atmosphere. The annealing process step can vary depending on the materials used in the fabrication of the devices of the present disclosure. For example, for GaAs the annealing temperature can be approximately 400° C. Next, as shown in FIG. 4J, a hard ferromagnetic layer 422 with dielectric barrier is applied to the NM 418, followed by a patterning of the lower NM layer 424, which is on a sacrificial silicon dioxide layer 425, as shown in FIGS. 4J and 4K, and application of a thicker photoresist 426 layer, as shown in FIG. 4L. In certain examples, the photoresist layer can range from about 1 μm to about 2 μm, or from about 0.5 μm to about 5 μm. FIG. 4M includes a lifting of the photoresist 426 layer from the substrate 402 and onto a substrate 402 having a soft ferromagnetic layer 428 with dielectric barrier layer 430. FIG. 4N shows an array of completed pixels 432 on the substrate 402. Spin valves or other spintronic devices based on dislocated semiconductor NMs in accordance with the present disclosure have significant advantages, namely, the devices leverage 1D spin-orbit coupling in screw dislocations that allow transporting spin without interference from spin-unpolarized electrons and a minimal effect of changing electron momentum (direction). Furthermore, the use of dislocated NMs vs. bulk materials broadens the palette of single-crystalline semiconductors in the devices, thereby allowing access to materials with different ionicity that are expected to yield different spin orientations. Spin valves as disclosed herein may in principle provide amplification along with switching functionalities or offer the possibility to convert the information carried by spin into optical and electrical signals. Additionally, spin valves as described herein may be more easily integrated with traditional semiconductor technology. In certain examples, the silicon NM pixels may be removed for evaluation and characterization by etching the silicon dioxide layer, a sacrificial layer, in hydrofluoric acid (HF), followed by wet transfer of the twisted Si NMs pixels to TEM windows for annealing and further characterization. Methods of the present disclosure to fabricate and realize defined dislocation arrangements in a reproducible way can be accomplished by semiconductor direct wafer bonding. The formation of such regular dislocation networks has been widely observed at the interface of bonded silicon wafers. Crystalline nanomembranes (NMs) are distinguished from bulk materials most significantly by their thin dimensions, flexibility, proximity of two surfaces or interfaces, and that in some part of their processing, nanomembranes are free of any constraint, for example, they can be released from a rigid handling substrate via removal of a sacrificial layer. Unique structural, electronic, and optical properties have been measured for these nanomembranes, both for flat and curled films. NMs may be transferred to a large variety of hosts. This ability to transfer can be successfully used for the fabrication of hybrid or highly mismatched single-crystal multilayer stacks and for the development of bendable and stretchable electronics. In certain examples of the process described herein, the substrate can be coated with a sacrificial layer. It should be noted that in certain examples, the second plurality of NMs is not patterned directly onto the first plurality of NMs, but on a different substrate, and then subsequently transferred onto the first plurality of NMs.

Further layers can be deposited onto one or more previous layer of the vertical spin valve, for example, the deposition of a ferromagnetic layer onto the second plurality of silicon nanomembranes. Devices fabricated according to embodiments disclosed herein, promise with long spin coherence times; the possibility to control spin texture by engineering NM materials; amplification along with switching functionalities; conversion of information carried by spin into optical and electrical signals; facile integration with traditional semiconductor technology; and the opportunity of vertical integration. In certain examples, a semiconductor spintronic device such as a spin-FET can be fabricated using a similar process. Rather than directly applying a ferromagnetic layer 422 as described previously herein, a dielectric layer and a non-magnetic metal, such as copper, gold, silver, platinum, or combinations thereof are applied to the to the perimeter of the nanomembrane layers having embedded screw dislocations. Next, a dielectric polymer, such as benzocyclobutene (BCB) can be applied to the array of nanomembranes prior to a deposition of an upper ferromagnetic layer to the semiconductor spintronic device, thus providing an array of pixels having nanomembranes with embedded screw dislocations for use as spin-FETs.

Figure 5A:
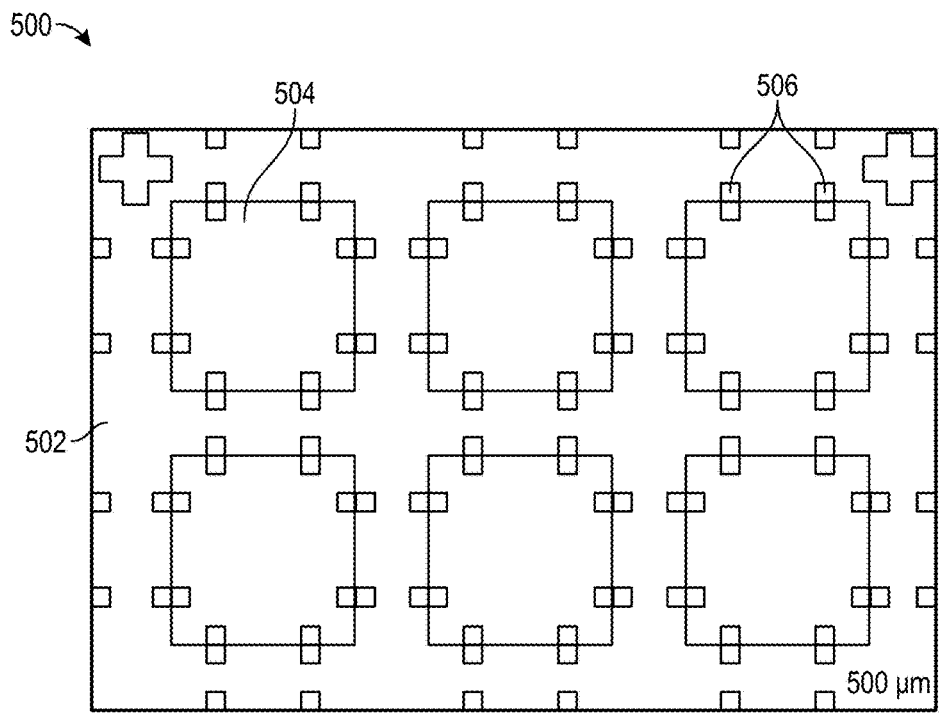
FIGS. 5A and 5B depict a series of photographs depicting various steps in a scalable fabrication of 2D arrays of vertical spin valves based on screw dislocations in nanomembranes (NMs), in accordance with the present disclosure.
Figure 5B:
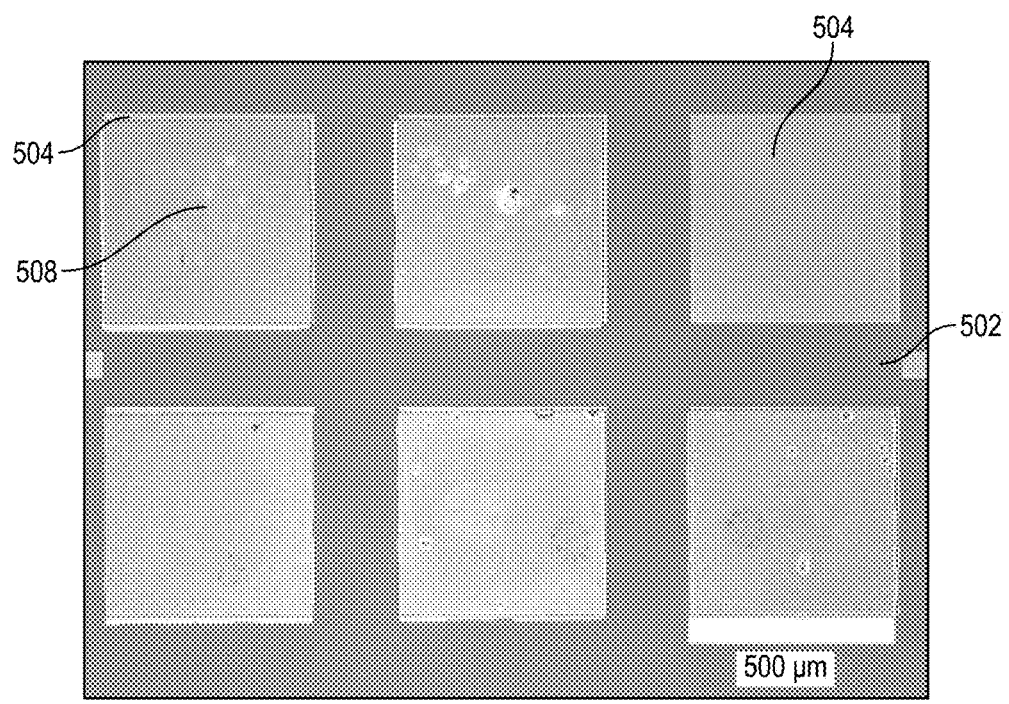

FIGS. 5A and 5B depict a series of photographs depicting various steps in a scalable fabrication of 2D arrays of vertical spin valves based on screw dislocations in nanomembranes (NMs), in accordance with the present disclosure. A series of photographs 500 is shown where a substrate 502 has a number of first layer silicon nanomembrane layers 504 held in place with photoresist anchors 506. The first layer silicon nanomembrane layers 504 have been etched in place on the substrate 502. A reference indicator shows a dimensional scale of 500 µm on the image. The photoresist anchors 506 prevent the silicon pixels from moving and allow for controlling the twist angle of the subsequent angle. FIG. 5B depicts an array of overlaid second nanomembrane layers 508 onto the first layer silicon nanomembrane layers 504 in place upon the substrate 502. It should be noted the small twist angle visible between the first layer silicon nanomembrane layers 504 and the overlaid second nanomembrane layers 508.

Figures 6A, 6B, 6C:
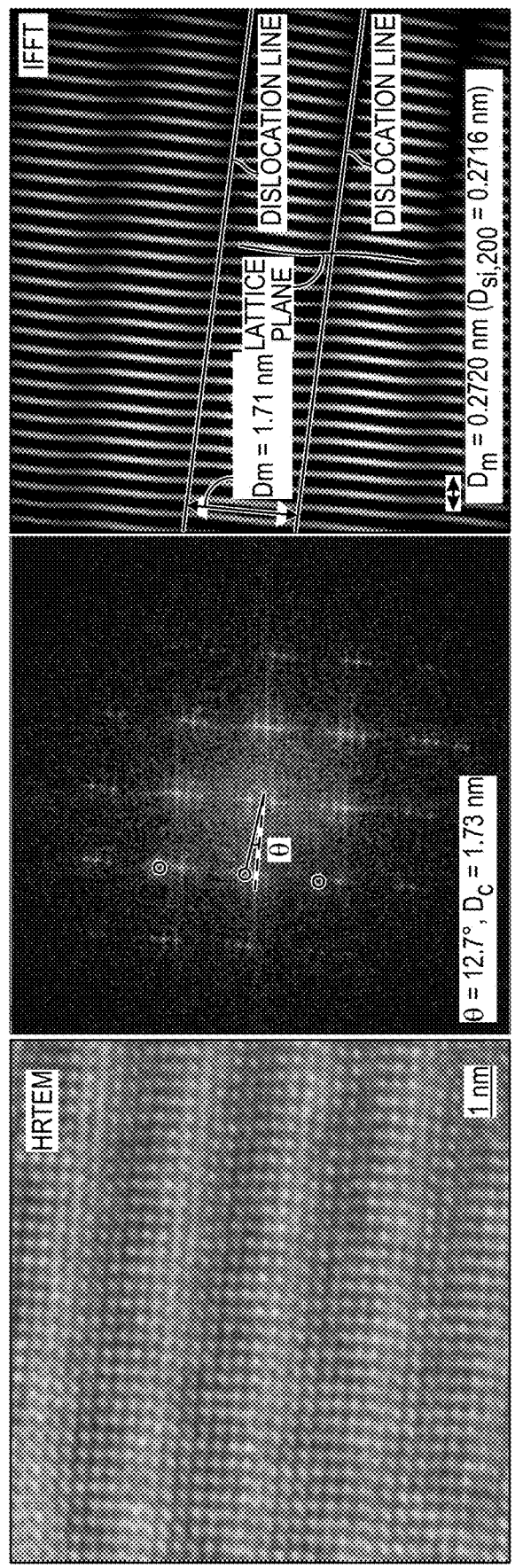
FIGS. 6A-6C depict a series of photographs depicting features of vertical spin valves based on screw dislocations in nanomembranes (NMs), in accordance with the present disclosure.

FIGS. 6A-6C depict a series of photographs depicting features of vertical spin valves based on screw dislocations in nanomembranes (NMs), in accordance with the present disclosure. The image in FIG. 6A is a high-resolution transmission electron microscope (HRTEM) image that illustrates the screw dislocations formed in the prototypes of devices and device fabrication results in accordance with the present disclosure. Images generated from 220 nm-thick Si nanomembranes are shown after a 6 hour furnace annealing at 1000° C. in an $N_2$ atmosphere. Fast Fourier transform (FFT) image analysis shown in the image of FIG. 6A provides an estimate of the diffraction pattern and enables the determination of the crystal structure in reciprocal space as shown in the image in FIG. 6B. The measurements of the twist angle are obtained between the crystal and the screw dislocation spacing is calculated using the equation:

$$D = \frac{a_{Si}}{2\sqrt{2}\sin\left(\frac{\psi_b}{2}\right)}$$

The twist angle obtained from the FFT image of FIG. 6B is 12.7 degrees with a calculated spacing between screw dislocations, $D_c$, of 1.73 nm. Next, in the image of FIG. 6C, an inverse FFT (IFFT) image can be used to measure distance between the lines between the spots circled in FIG. 6B, which is close to the calculated distance. The results obtained from IFFT closely match the calculation of screw dislocations, at a measured distance, $D_m$, of 1.71 nm. Furthermore, a measured plane spacing, $d_m$, is determined to be 0.2720 nm, which confirms the presence of silicon, as it is close to the theoretical $d_{Si,200}$ of 0.2716 nm.

Examples of the present disclosure provide semiconductor devices, specifically vertical spin valve devices or spin-FETs, having advantages over existing technologies in that such devices promise long spin coherence times, the ability to control spin texture by engineering nanomembrane materials, providing amplification along with switching functionalities, and offering the possibility to convert the information carried by spin into optical and electrical signals. Such devices can be easily integrated with traditional semiconductor technology, offering the opportunity of vertical integration, and enable the use of nanomembranes for spin valves having screw dislocations including nanoscale thickness, a high probability of screw dislocations being uniform across the thickness, applicability to a wide range of materials, tunable spin texture and gapless interfaces between nanomembranes. In addition to spin valve applications, the devices of the present disclosure can be used in spintronics and methods for their production. Devices having screw dislocation networks and methods of the present disclosure can also be applied towards operation and fabrication of semiconductor vertical spin valves, hard drives, MRAM, magnetic sensors, and quantum computation applications.

Devices or vertical spin valves of the present disclosure can produce electron spins as qubits, thereby allowing an electron spin to be held in a superposition of up and down states and enabling applications for coherent channels to store and transfer spin qubits. Electrons can be in spin up or spin down, or any state in between These superposition states must have a controllable and predictable phase or maintain coherence, in order to provide devices that can encode information. Such devices as described herein can provide screw dislocations having a long coherence time in field effect transistors (FETs) useful for quantum coupling by injecting electrons into the dislocation channel and into the other ferromagnet. Limitations of existing devices can include inability to maintain long coherence times at room temperatures and above. By contrast, devices of the present disclosure can provide long coherence times as spin states in screw dislocations are topologically protected, and therefore be used as building blocks for spin-based quantum computing.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. the term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

What is claimed is:

1. A semiconductor spintronic device, comprising:
   a substrate;
   a first ferromagnetic contact layer and a second ferromagnetic contact layer disposed on the substrate; and
   a semiconductor nanomembrane comprising a 2D array of screw dislocations throughout its thickness disposed between the first ferromagnetic contact layer and the second ferromagnetic contact layer.

2. The semiconductor spintronic device of claim 1, wherein:
   the first ferromagnetic contact layer is in direct contact with the substrate and comprises a soft ferromagnetic material; and
   the second ferromagnetic contact layer comprises a hard ferromagnetic material.

3. The semiconductor spintronic device of claim 1, wherein the semiconductor spintronic device is switchable between a low-resistance state and a high-resistance state by applying current to the semiconductor spintronic device.

4. The semiconductor spintronic device of claim 1, wherein the semiconductor nanomembrane comprises silicon carbide and the substrate comprises silicon.

5. The semiconductor spintronic device of claim 1, wherein the semiconductor nanomembrane comprises a multilayered semiconductor nanomembrane.

6. The semiconductor spintronic device of claim 5, wherein a second layer of the multilayered semiconductor nanomembrane is overlaid upon a first layer of the multilayered semiconductor nanomembrane at a controlled twist angle from 0 degrees to about 45 degrees.

7. The semiconductor spintronic device of claim 1, wherein the semiconductor nanomembrane has a thickness of from about 50 nm to about 500 nm and a lateral dimension of from about 50 μm to about 600 μm.

8. The semiconductor spintronic device of claim 1, further comprising:
   a first barrier layer disposed between the semiconductor nanomembrane and the second ferromagnetic contact layer; and
   a second barrier layer disposed between the semiconductor nanomembrane and the first ferromagnetic contact layer.

9. The semiconductor spintronic device of claim 1, further comprising a metal electrode in contact with a barrier layer disposed around the semiconductor nanomembrane.

10. A vertical spin valve, comprising the semiconductor spintronic device of claim 1.

11. A spin field effect transistor, comprising the semiconductor spintronic device of claim 1.

* * * * *